US005539759A

United States Patent [19]

Chang-Hasnain et al.

[11] Patent Number: 5,539,759
[45] Date of Patent: Jul. 23, 1996

[54] SINGLE MODE LASER WITH A PASSIVE ANTIGUIDE REGION

[75] Inventors: Constance J. Chang-Hasnain, Stanford; Yongan Wu, Palo Alto; Rashit Nabiev, Mountain View, all of Calif.

[73] Assignee: Board of Trustees of the Leland Stanford Junior University, Stanford, Calif.

[21] Appl. No.: 317,393

[22] Filed: Oct. 4, 1994

[51] Int. Cl.$^6$ .................................................. H01S 3/098
[52] U.S. Cl. ............................ 372/19; 372/98; 372/92; 372/64; 372/102
[58] Field of Search ............................. 372/45, 46, 19, 372/102; 378/50, 92

[56] References Cited

U.S. PATENT DOCUMENTS

| 5,272,711 | 12/1993 | Mawst et al. | 372/45 |
| 5,276,700 | 1/1994 | Jansen et al. | 372/50 |
| 5,349,602 | 9/1994 | Mehuys et al. | 372/50 |

Primary Examiner—Leon Scott, Jr.
Attorney, Agent, or Firm—Marek Alboszta

[57] ABSTRACT

A single mode laser with a laser cavity consisting of an active medium and a first and second reflectors with an antiguide region or layer having a high refractive index positioned adjacent to the laser cavity to bleed off higher order lasing modes and preventing them from attaining the lasing condition. Specifically, light belonging to higher order modes leaks or bleeds into the antiguide region from the laser medium and from the first and second reflectors. When spacers for selecting the desired wavelength of laser light are provided, the light travelling through them leaks into the antiguide layer as well.

Optimization of the bleeding of higher order modes into the passive antiguide region can be achieved by adjusting a taper angle of the laser cavity. Furthermore, by adjusting the ratio of the equivalent refractive index of the laser cavity and the passive antiguide region single mode operation at high current levels can be realized for apertures as large as 30 μm. In addition, such lasers exhibit a repeatable and predetermined direction of polarization, most commonly along the [011] crystal orientation of the laser medium.

21 Claims, 6 Drawing Sheets

SINGLE MODE LASER WITH A PASSIVE ANTIGUIDE REGION

This invention was made with Government support under contract No. N00014-89-K-0067, awarded by the Joint Services Electronics Program and the Packard Foundation. The Government has certain rights in the invention.

BACKGROUND

1. Field of the Invention

The present invention relates to the field of lasers, and in particular to lasers capable of delivering light of a single mode at high power and through a large aperture.

2. Description of Prior Art

The field of optics and optical circuits is maturing rapidly and efforts to miniaturize the individual optical elements are underway. Among the most important of these elements are lasers for delivering high-quality monochromatic light. It is believed that vertical-cavity surface-emitting lasers (VCSELs) and related laser diodes may satisfy many of the requirements imposed on the new generation of light sources. To be effective a VCSEL should have a large aperture, provide single-mode emission, have a low threshold current, high power, and exhibit a repeatable and predetermined polarization orientation.

There are two generic VCSEL structures. The first is a laser-post-type index-guided laser described in detail by J. L. Jewell et al. in *Electronics Letters*, 25, 1989, p. 1123 and by R. S. Geels et al. in *IEEE Photonics Technology Letters*, Vol. 2, No. 4., p. 234, April 1990. The laser post or laser cavity has an active region made of a laser medium, usually GaAs, InGaAs, InGaAsP, or InP. The laser medium can be present in bulk form or as quantum wells, quantum wires, or even quantum dots. A set of reflectors or mirrors, usually multilayer Bragg reflectors, are positioned on top and bottom of the active region. Frequently, spacers are placed between the active region and the reflectors to set the cavity length. This structure is typically grown on a substrate and the finished post is encapsulated by a current-blocking layer, usually polyimide or photoresist, which has a significantly lower index of refraction than the materials making up the laser post. By virtue of its lower refractive index the current-blocking layer traps the light generated by the laser medium inside the post (i.e., the blocking layer ensures that the post becomes a highly efficient waveguide). The resulting laser produces a single longitudinal mode but multiple transverse modes at low threshold currents.

Unfortunately, while providing suitable quality transverse and longitudinal mode laser light with a high degree of intrinsic polarization, this type of laser is incapable of sustaining single-mode emission even at low power levels. That is because the driving current induces higher order transverse and longitudinal lasing modes. Consequently, the laser-post-type index-guided laser lacks the necessary performance criteria for application in optical circuits.

The second type of VCSELs are proton-implanted gain-guided lasers described by the applicant in *IEEE Photonics J. Quantum Electronics*, 27, p. 1402, 1991 and in *IEEE J. Quantum Electronics*, 27, p. 1377, 1991. As a result of their large size, commonly about 10 µm, these lasers have a high threshold current. In addition, they maintain linear polarization of the basic transverse mode ($TEM_{00}$) near threshold current only, i.e., at currents equal to 1.4 to 2 times the threshold current. At higher currents the polarization directions become random when more transverse modes begin lasing. Moreover, the polarization varies in a stochastic manner from one laser to another. Thus, gain-guided lasers can not be set up to operate in concert, e.g., in array structures, and have a severely limited operating range.

The above solutions clearly indicate that the properties requisite of a laser source for optical applications can not be presently combined in one laser structure. In particular, prior art devices specifically fail to produce a single, fundamental mode ($TEM_{00}$) laser operable over a wide power range and exhibiting a predetermined polarization. Also, prior art lasers are limited to small apertures typically ranging from 2 to 5 µm. Meanwhile, optimal aperture dimensions are much larger, e.g., between 8 µm and 30 µm, depending on the application.

OBJECTS AND ADVANTAGES OF THE INVENTION

In view of the above it is an object of the present invention to provide a single mode laser capable of operating in the fundamental mode $TEM_{00}$, generating light polarized along a predetermined direction of polarization, and operating over a wide power range.

It is a further object of the invention to ensure that this single mode laser becomes active at a low threshold current. Ultimately, the object of the invention it to provide a single mode laser having a large aperture rendering it useful for implementation in optical circuits.

These and other objects and advantages will become more apparent after consideration of the ensuing description and the accompanying drawings.

SUMMARY OF THE INVENTION

Surprisingly a single mode laser satisfying the objectives of the invention can be produced by proceeding specifically against the teachings of prior art, by surrounding a laser cavity consisting of an active medium and first and second reflectors with an antiguide region or layer having a high refractive index. Such antiguide region suppresses higher order modes by preventing them from attaining the lasing condition while preserving the fundamental transverse mode of the laser. Specifically, light belonging to higher order modes leaks or bleeds into the antiguide layer from the laser medium and from the first and second reflectors. When spacers for selecting the desired wavelength of laser light are provided, the light travelling through them leaks into the antiguide layer as well. By doing this, higher order modes can be effectively suppressed at electric current levels as high as fourteen times the threshold current at which the lasing material starts lasing.

Furthermore, analysis has revealed that by redesigning the first and second reflectors, preferably a set of Bragg reflectors, to vary the optical penetration depth of the laser into the mirror and by adjusting the ratio of the equivalent refractive index of the laser cavity and the passive antiguide region, one can achieve single mode operation at high current levels for apertures ranging up to 30 µm in diameter. In addition, such lasers exhibit a repeatable and predetermined direction of polarization, most commonly along the [011] crystal orientation of the laser medium. Such lasers are very practical as is the method for producing them.

A detailed description of the laser according to the invention and method for producing it are set forth below in reference to the enclosed drawing figures.

DESCRIPTION

Figure 1:
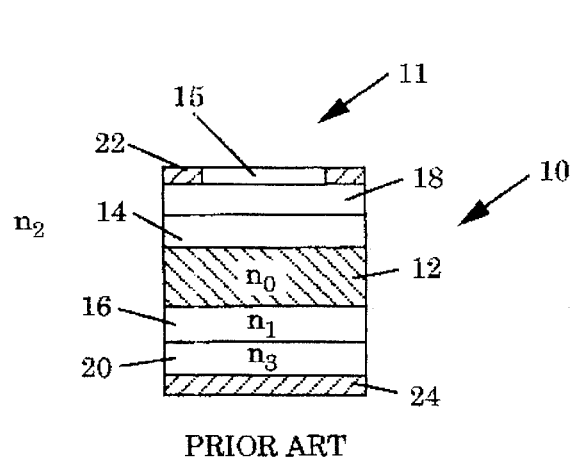
FIG. 1 is a simplified sectional side view of a prior art laser structure.

A brief review of prior art will aid in gaining full appreciation for the new single-mode laser. FIG. 1 shows a simplified structure of a conventional vertical-cavity surface-emitting laser (VCSEL) 11. Here, a VCSEL structure or laser cavity 10 consists of a conventional laser medium sandwiched between a first spacer 14 and a second spacer 16. A first reflector 18 and a second reflector 20 are positioned by spacers 14 and 16 respectively. A first contact 22 and a second contact 24 are provided at the top and bottom of laser cavity 10 respectively. Contacts 22 and 24 deliver an electrical current (I) for pumping laser medium 12 to activate laser 11.

First contact 22 has an output coupler or window 15 for transmitting the laser light to the outside. Various optical elements (not shown) can be positioned above for guiding the exiting laser beam. Cavity 10 with contacts 22 and 24 is most frequently surrounded by air or some other protective and current-blocking material (not shown).

The refractive index $n_2$ of the protective material (e.g., air; refractive index=1) is much lower than the index of refraction of any of the elements making up cavity 10. In fact, the refractive index, $n_0$, of laser medium 12, the index, $n_1$, of spacers 14, 16, and the index, $n_3$, of reflectors 18, 20 is generally chosen to be 2 to 3 times larger than $n_2$. This is done to ensure that cavity 10 acts as a waveguide and does not leak laser light to the surroundings, since this would prevent lasing.

To operate laser 11 a potential difference is applied between contacts 22 and 24 to produce a current which traverses lasing cavity 10. When the current reaches a threshold value, $I_{th}$, laser medium 12 starts to lase in the low order modes including the fundamental mode ($TEM_{00}$). Then, as the current increases, even higher order transverse lasing modes appear. In effect, the $TEM_{00}$ mode is thus increasingly drowned by higher order modes which propagate through cavity 10 with negligible losses since the latter acts like a waveguide. Thus, single mode operation at high currents, i.e., high power, is thwarted.

Figure 2:
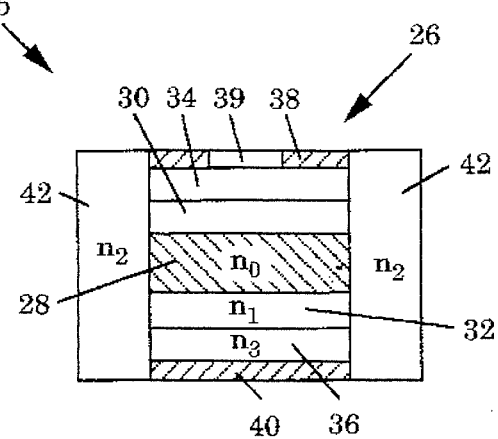
FIG. 2 is a simplified sectional side view of a single mode laser with a passive antiguide region according to the invention.

FIG. 2 shows a simplified sectional side view of a single transverse mode surface-emitting laser 25 according to the invention. A lasing cavity 26 is made up of an active material or laser medium 28 residing between two spacers 30, 32 and a first reflector 34 as well as a second reflector 36. According to FIG. 2 medium 28 is relatively thick for illustrative purposes. Most commonly its thickness ranges from a few tens to a few hundred Angstroms. In this embodiment medium 28 is only 80 Angstroms thick, and is a conventional lasing material.

Spacers 30 and 32 are sufficiently thick to ensure that the distance between reflectors 34 and 36 is equal to the wavelength of the intended laser, or to a multiple of that wavelength. For lasers emitting visible light the wavelength ranges between approximately 400 and 800 nm. The choice of proper attributes for spacers 30 and 32 constitutes prior art. Reflectors 34 and 36 are preferably Bragg reflectors or other mirrors affording sufficiently high reflectance to sustain lasing. A contact 38 and a contact 40 are positioned to pass an electrical current through laser cavity 26. Contact 38 is provided with an output coupler 39 for extracting the laser light.

In distinction to prior art lasers, a passive antiguide region 42, rather than only a protective layer, surrounds cavity 26. Antiguide region 42 blocks the flow of electrical current. The refractive index $n_2$ of the material of antiguide region 36 is chosen preferably larger or substantially equal to an equivalent refractive index $n_{eq}$ of laser cavity 26. The equivalent refractive index $n_{eq}$ is a weighted mean of the refraction indices of lasing medium 28 ($n_0$), spacers 30, 32 ($n_1$), and reflectors 34, 36 ($n_2$). In particular, $n_{eq}=[(l_0 \times n_0)+(l_1 \times n_1)+(l_3 \times n_3)]/(l_0+l_1+l_3)$, where $l_0$, $l_1$, and $l_3$ are the total thicknesses of lasing medium 28, spacers 30, 32, and reflectors 34, 36 respectively. Most preferably, the ratio of the refractive index $n_2$ of antiguide region 36 to $n_{eq}$ ($n_2/n_{eq}$) is about 1.1.

Figure 3A:
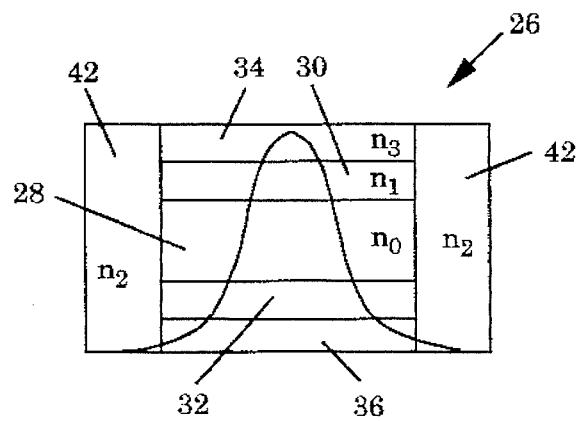
FIG. 3A is a diagram illustrating losses sustained by the fundamental mode ($TEM_{00}$) due to passive antiguide region in the single mode laser of FIG. 2.

FIG. 3A shows the effect of passive antiguide region 42 on the fundamental transverse lasing mode ($TEM_{00}$) set up inside laser cavity 26 shown in FIG. 2. For clarity, the intensity of radiation is graphed along the y-axis while its spatial distribution is graphed along the x-axis. In fact, almost the same intensity pattern is found along the x-axis at any height inside cavity 26. The fringes of the TEM$_{00}$ intensity distribution pass into antiguide region 42. In effect, that portion of TEM$_{00}$ mode is leaked or lost in antiguide region 42.

Figure 3B:
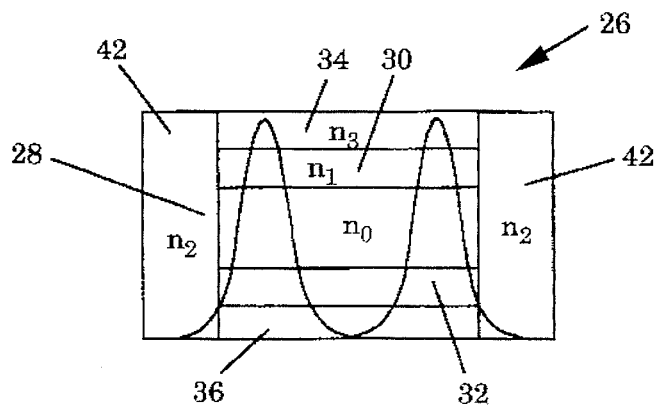
FIG. 3B is a diagram illustrating losses sustained by the second mode ($TEM_{01}$) due to passive antiguide region in the single mode laser of FIG. 2.

FIG. 3B illustrates the intensity distribution of a second transverse lasing mode (TEM$_{01}$) set up inside cavity 26. The portions of TEM$_{01}$ mode extending past cavity 26 into antiguide region 42 are bled off during operation. These leaked fringe regions of TEM$_{01}$ are larger than those of TEM$_{00}$. It is also true that every higher order mode, due to its inherent intensity distribution, has larger fringe regions which are bled off more than the TEM$_{00}$ mode.

Laser 25 of FIG. 2 is activated by passing a current equal to or larger than a threshold current I$_{th}$ through cavity 26. This induces laser medium 28 to set up a laser inside cavity 26 between reflectors 34 and 36. On its path between reflectors 34 and 36 the laser passes through spacers 30 and 32. These ensure that only the desired wavelength of light is lasing inside cavity 26.

When the current is just slightly higher than threshold current I$_{th}$ only the fundamental mode TEM$_{00}$ is active. The intensity distribution of TEM$_{00}$ in cavity 26 is illustrated in FIG. 3A. As the current increases there is a tendency to establish higher order lasing modes inside cavity 26. For example, FIG. 3B shows the intensity distribution corresponding to the TEM$_{01}$ mode inside cavity 26.

A predominant portion of the intensity distribution of the TEM$_{00}$ mode is located in the center of cavity 26. This light is reflected back and forth on successive round trips between reflectors 34 and 36. Meanwhile, the small amount of intensity of TEM$_{00}$ in the fringe regions of cavity 26 leaks into antiguide region 42 during these round trips. Thus, the total losses of the TEM$_{00}$ mode include typical losses encountered in conventional VCSELs (reflective and scattering losses) and bleeding introduced by antiguide region 42.

Fortunately, as shown in FIG. 3A, the bleeding losses for TEM$_{00}$ are negligible since only the fringe portions of the intensity distribution are subject to bleeding. This means that the losses incurred by TEM$_{00}$ on each round trip between reflectors 34 and 36, referred to as modal loss Δα, are small. Typically, Δα for TEM$_{00}$ can be as low as 0.01% to 1%.

The situation is very different for the TEM$_{01}$ mode. As evidenced by FIG. 3B, a significant portion, approximately 2.5 times more than for TEM$_{00}$, of the intensity distribution bleeds into antiguide region 42. In practice, this means that TEM$_{01}$ sustains losses which prevent it from lasing at all.

Higher order modes which normally begin lasing at high values of current I experience the same fate as TEM$_{01}$, since an even more significant portion of their intensity distribution falls outside cavity 26 into antiguide region 42. The resulting modal losses prevent the corresponding modes from reaching the lasing state. Meanwhile, lasing of TEM$_{00}$ mode is maintained. In fact, the single mode laser according to the invention preserves single mode emission up to 12 times the threshold current I$_{th}$. In contrast, prior art VCSELs can support single mode operation up to only a few times I$_{th}$, typically twice I$_{th}$.

Figure 4:
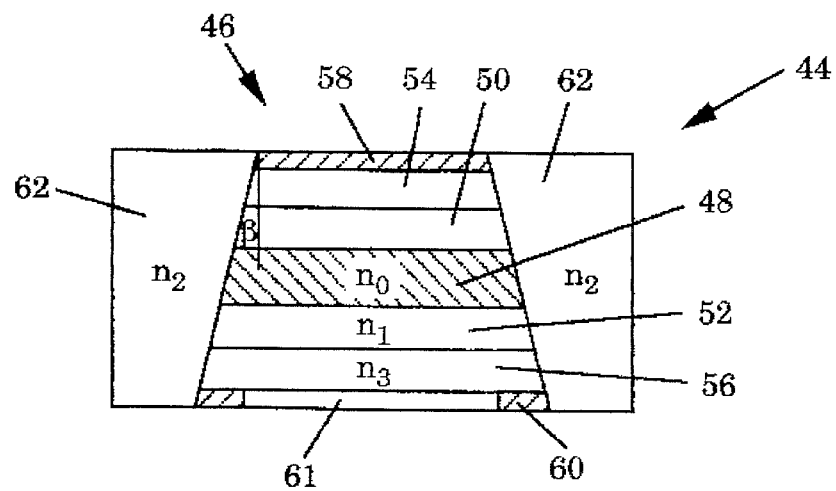
FIG. 4 is a simplified sectional side view of another single mode laser with a passive antiguide according to the invention.

FIG. 4 illustrates another simplified embodiment of a single mode laser 44 according to the invention. A laser cavity 46 of laser 44 has sides slanted at a taper angle β and includes a laser medium 48, two spacers 50, 52, two reflectors 54, 56, and two contacts 58, 60. These elements are juxtaposed in the same order as in the previous embodiment. A passive antiguide region 62 surrounds cavity 46.

Figure 5A:
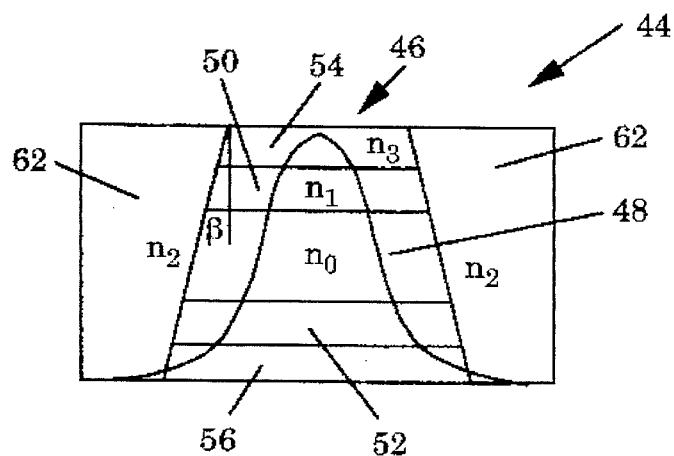
FIG. 5A is a diagram illustrating losses sustained by the fundamental mode ($TEM_{00}$) due to passive antiguide region in the single mode laser of FIG. 4.
Figure 5B:
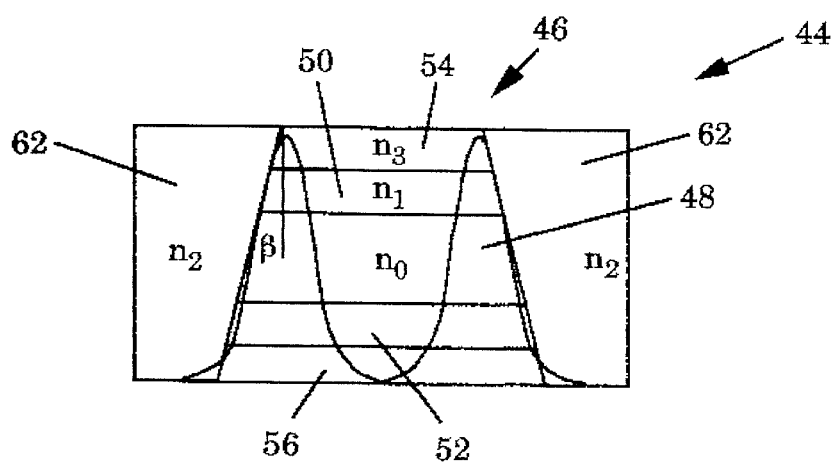
FIG. 5B is a diagram illustrating losses sustained by the second mode ($TEM_{01}$) due to passive antiguide region in the single mode laser of FIG. 4.

Laser 44 activates when an electrical current is passed through laser medium 48. Again, depending on how much the current exceeds threshold current I$_{th}$, several lasing modes attempt to establish themselves inside cavity 46. FIG. 5A and FIG. 5B show the intensity distributions for TEM$_{00}$ and TEM$_{01}$ modes inside cavity 46 respectively. Because of taper angle β of cavity 46 TEM$_{00}$ mode experiences higher leakage losses into antiguide region 62 than in the previous embodiment. However, the losses it sustains are sufficiently low to allow the TEM$_{00}$ mode to lase. On the other hand, the TEM$_{01}$ mode sustains higher losses yet. In fact, as taper angle β increases TEM$_{01}$ is effectively prevented from lasing up to currents of 12 times I$_{th}$ and even higher. Higher order modes experience the same fate.

Figure 6:
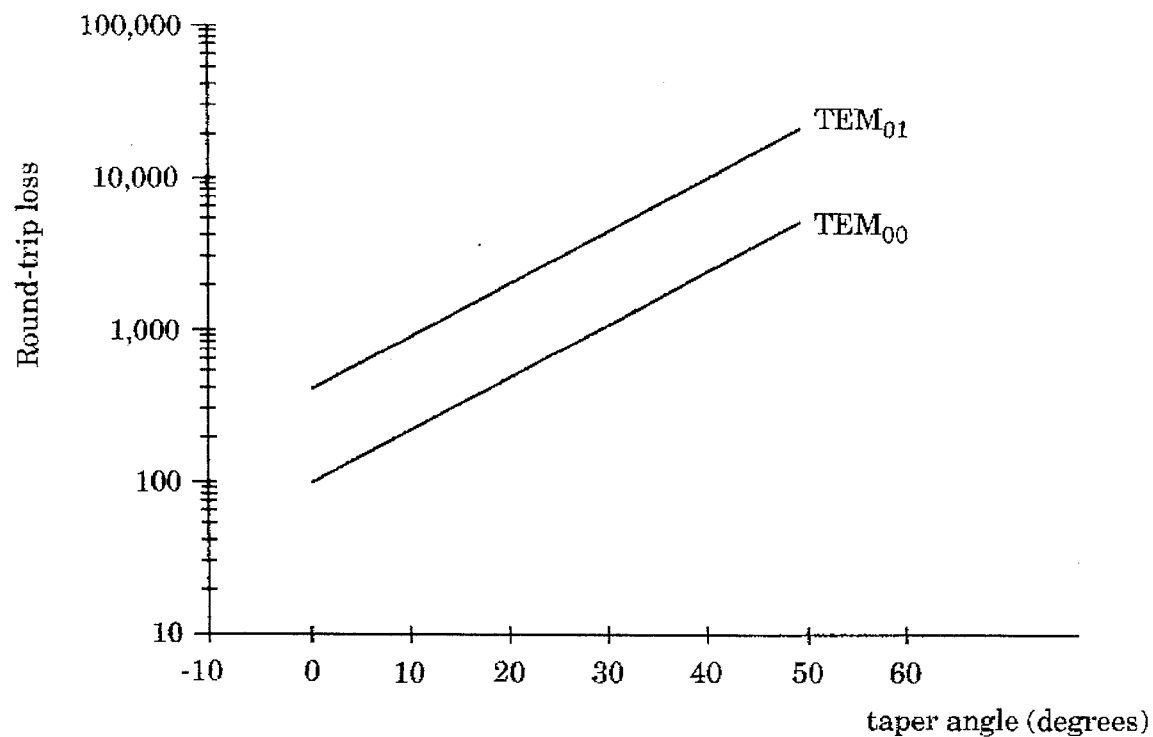
FIG. 6 is a graph of $TEM_{00}$ and $TEM_{01}$ modal losses as a function of the taper angle ($\beta$) of the laser cavity in the single mode laser of FIG. 4.

The effect of taper angle β on modal losses is elucidated by the logarithmic graph of FIG. 6. TEM$_{00}$ mode losses are significantly lower than the losses for TEM$_{01}$ at the same taper angle. Furthermore, both modal losses increase exponentially as taper angle β increases and preserve a constant separation. For large aperture lasers, as long as angle β is less than 60°, the modal loss increases in proportion to $e^{k\beta}$, where k≈0.1. Higher order modes experience even larger losses with increasing taper angle β, and, if graphed, they would be situated above the TEM$_{01}$ curve.

Figure 7:
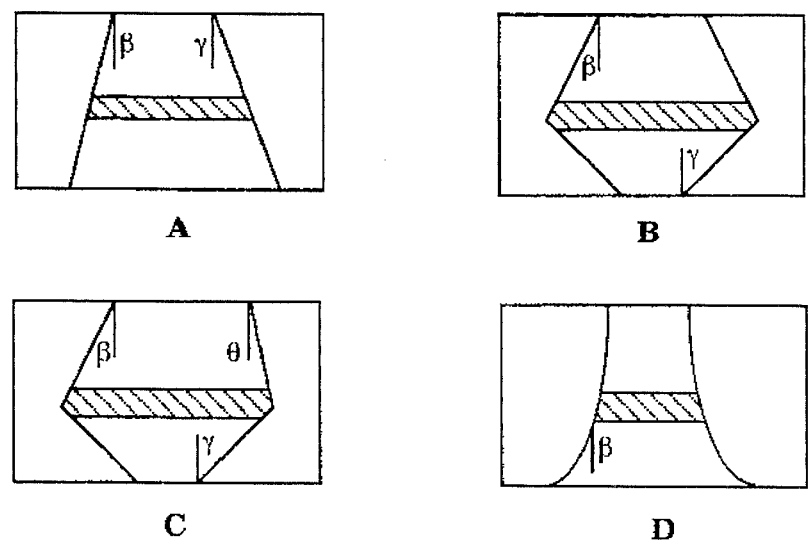
FIG. 7 shows several simplified sectional views of single mode lasers with various taper angles according to the invention.

Based on the above relationship of modal losses to taper angle β a person skilled in the art can select proper inclinations in building single mode lasers. In addition, taper angle β does not need to be constant along the entire laser cavity. Four practical examples shown in FIG. 7 illustrate this point. In example A the two sides of the laser cavity have different taper angles β and γ. In example B taper angle β of the top portion is smaller than taper angle γ of the bottom portion of the laser cavity. The third example, C, indicates three different taper angles β, γ, and θ. Finally, the fourth example, D, depicts a laser cavity with a continuosly varying taper angle β. This example is particularly advantageous and represents the preferred embodiment for many practical and theoretical reasons, as described below.

Figure 8:
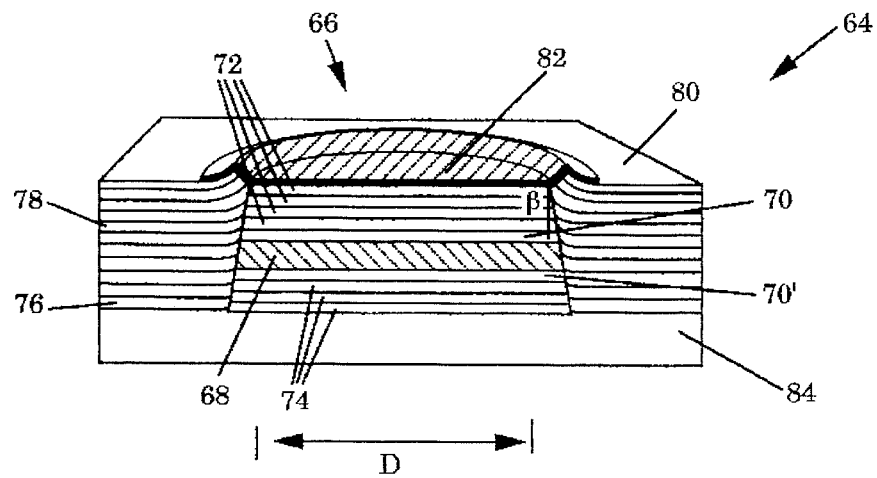
FIG. 8 is a detailed, sectional perspective view of a preferred embodiment of a single mode laser with an antiguide region according to the invention.

FIG. 8 shows the preferred embodiment of a practical single mode laser 64 according to the invention. A laser cavity 66 contains an active layer or a laser medium layer 68 which is made of InGaAs. The index of refraction, n$_0$, of laser medium layer 68 is 3.608. Of course, other lasing materials, e.g., InGaAsP, can also be used. A person skilled in the art will be able to make an appropriate choice based on desired laser output characteristics.

Spacer layers 70, 70' for selecting a particular laser wavelength are located above and below laser medium layer 68. The thickness of spacer layers 70, 70', together with laser medium layer 68, equals the desired wavelength λ of laser light (or an integral multiple of wavelength λ) and their refractive index, n$_1$, is equal to 3.425. Although the preferred embodiment employs only two such layers more can be present. The only restriction on spacer layers 70, 70' is that they should not introduce significant losses to laser light.

Four reflecting layers 72 are positioned on top of spacer layer 70, and three reflecting layers 74 are positioned below spacer layer 70'. In the preferred embodiment reflective layers 72 and 74 are 0.4 μm thick Bragg mirrors and their refractive index, n$_3$, is equal to 3.241. Although only four layers 72 and three layers 74 are illustrated in the preferred embodiment, more or fewer can be used. In effect, the number and index of refraction n$_3$ of Bragg mirrors determines the degree of reflectivity attained and the penetration depth of laser light into layers 72 and 74. The optimal penetration depth ranges between 0.2 and 2 μm.

In some alternative embodiments up to 40 Bragg mirrors can be used to obtain nearly 100% reflectivity. Also, dielectric mirrors, semiconductor/native oxide mirrors, metal mirror semiconductor/resin, semiconductor/air mirrors or semiconductor/semicondutor mirrors.can be used in place of Bragg mirrors. These alternate mirrors can exhibit any of the myriad material compositions known in the art. As in conventional lasers, one of these mirrors will act as the highly reflecting mirror and the other, having a lower reflectivity, will be used to couple out the laser light.

The sides of layers 68, 70, 70', 72, and 74 are sloped at a varying taper angle β. Thus, entire cavity 66 is tapered. A substrate layer 76 of GaAs forms the base on which cavity 66 rests. The sides of cavity 66 are covered with nine passive antiguide layers 78 made of AlGaAs. In the preferred embodiment the ratios of the individual components are $Al_{0.2}Ga_{0.8}As$. This lends antiguide layers 78 an index of refraction, $n_2$, equal to 3.425. Moreover, antiguide layers 78 are 0.4 mm thick and alternatively n-i-p-i doped (doping codes: n-negative; i-intrinsic (neutral); p-positive). This sequence ensures that layers 78 block the flow of any electrical current.

An inert, undoped protective layer 80 resides on top of the uppermost of antiguide layers 78. In the preferred embodiment layer 80 is 0.2 mm thick and made of GaAs, just like substrate layer 76. A disc-shaped top electrical contact 82, is located on top of cavity 66. Contact 82 partially overlaps protective layer 80 along its circumference and covers fully the top of cavity 66. In the preferred embodiment contact 82 consists of a 250 Angstroms layer of titanium and a 300 Angstrom layer of gold. The function of contact 82 is to provide, in concert with a second electrical contact 84, current I for pumping laser medium layer 68. In this embodiment second electrical contact 84 also serves as a support layer. Support layer 84 provides mechanical stability to cavity 66, antiguide layers 78, and the remainder of the laser structure.

Practical laser 64 of FIG. 8 operates just like the simplified embodiments discussed above. Current I generated between contact 82 and support layer 84 induces lasing inside cavity 66. Laser light is coupled out through reflecting layers 74 and support layer 84. (Of course, in alternate embodiments laser light could be coupled out through contact 82 if the latter were transparent to the laser light.)

The effective beam width D of the light coupled out of cavity 66 through support layer 84 in this embodiment can range up to 30 μm. Such large apertures render laser 64 useful in optical circuits, interconnects, and other applications. The output is single mode, $TEM_{00}$, polarized along the [011] crystal orientation of laser medium layer 68. The laser operates over a wide power range, up to 12 times threshold current $I_{th}$ in some cases. In addition, threshold current $I_{th}$ is very low, and ranges between 0.8 and 1.5 mA.

Figure 13:
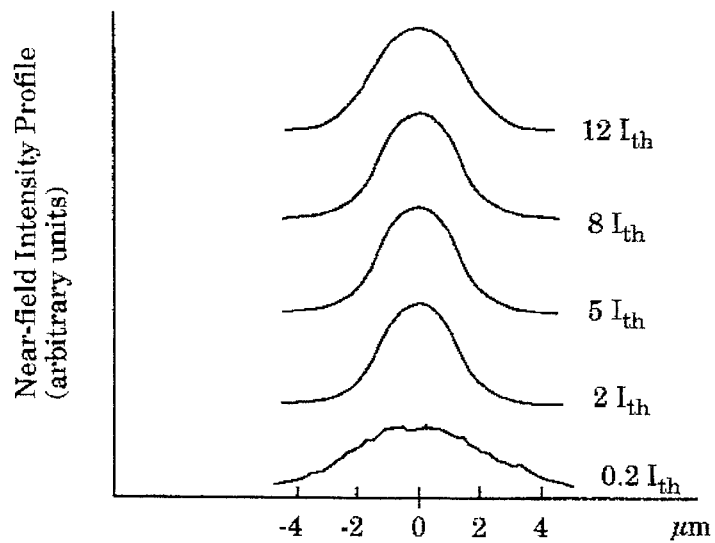
FIG. 13 is a graph of the near-field intensity profile of a single mode laser according to the invention with an 8 μm beam diameter.

In particular, FIG. 13 shows a graph of the near-field intensity profile of laser 64 with an 8 μm aperture. As evidenced by this graph, single mode profile is preserved up to $12 \times I_{th}$ with minimal broadening of the near-field profile. Threshold current $I_{th}$ is equal to 1.5 mA.

Figure 14:
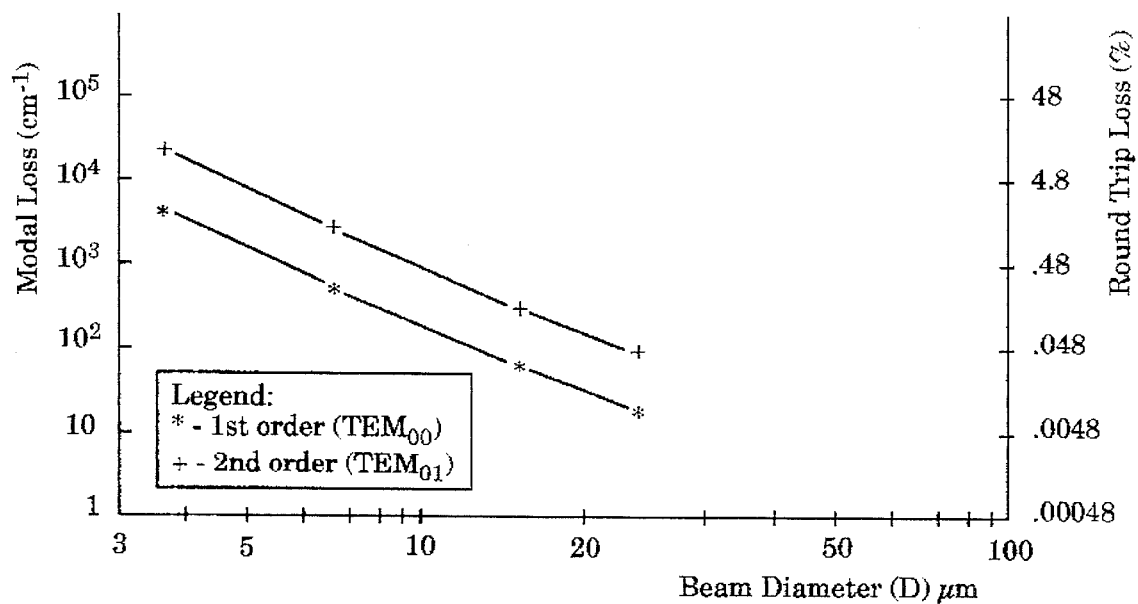
FIG. 14 is a graph plotted on a double-logarithmic scale showing the modal loss for first and second order lasing modes as a function of beam diameter in a single mode laser according to the invention.

Additionally, FIG. 14 shows a double-logarithmic graph showing the modal loss for first and second order lasing modes as a function of beam diameter in a single mode laser according to the invention. A person skilled in the art can use this graph to determine the proper aperture for a single mode laser.

DESCRIPTION—MANUFACTURE OF A SINGLE MODE LASER

Figure 9:
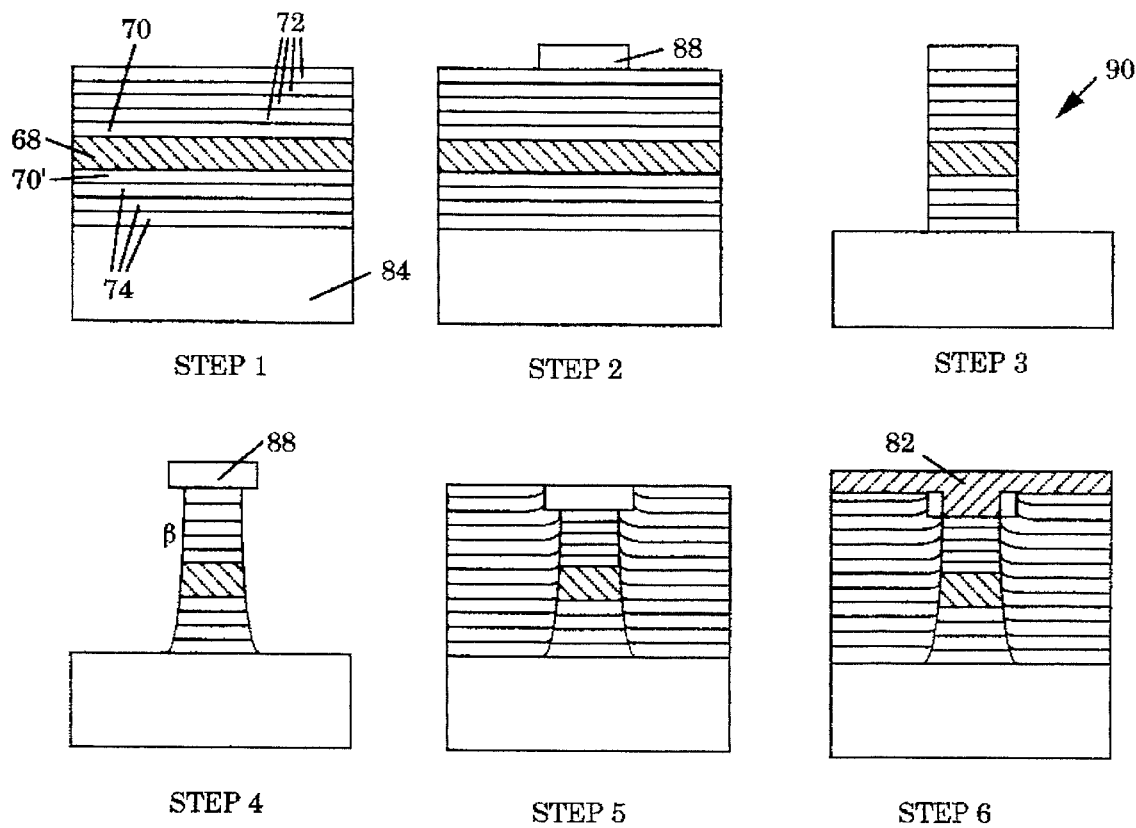
FIG. 9 illustrates a fabrication process of a single mode laser according to the invention.

FIG. 9 shows in 6 steps a method for producing single mode laser 66 of FIG. 8. In step 1 the basic structure of cavity 66 is grown by molecular beam epitaxy (MBE) or organometallic chemical vapor deposition (OMCVD). Materials different from the ones mentioned above may be used during the deposition process to vary the penetration depth of laser light into the Bragg mirrors 72 and 74.

In step 2 an etching mask 88 is applied on top of the uppermost Bragg mirror 72. Mask 88 can be made of $SiO_2$ or SiN by chemical vapor deposition (CVD) and subsequent lithography. Then, in step 3, a laser post 90 is formed by a dry or wet etching process. Suitable dry etching techniques include Reactive Ion Etching (RIE) or Electron Cyclotron Resonance (ECR) etching using $SiCl_4$ plasma. In some cases, if dry etching is used, a shortened wet etching step can be helpful in removing surface damage commonly caused by dry etching. The etching depth can be adjusted for optimum performance. In this case all layers, except for the bottom substrate layer 76, are etched away under mask 88 down to the support layer 84.

During step 4 a chemical etching step is performed to produce a slant at taper angle β of laser post 90. This is achieved, most preferably, by dipping post 90 in a $Br_2$ in methanol solution (1%) for about 20 seconds. Taper angle β obtained is variable along the height of post 90. The taper will aid in step 5 when passive antiguide layers 78 are regrown around laser post 90.

In step 5 nine layers of n-i-p-i doped $Al_xGa_{1-x}As$ layers are regrown by OMCVD. Slight GaAs growth can be promoted at the beginning of the regrowth process to ensure better quality of final passive antiguide layers 78 obtained. The x value is chosen such that antiguide layers 78 have higher refractive index than Bragg mirrors 72 and 74, i.e., $n_2 > n_3$. In the preferred embodiment x=0.2. In addition to regrowing layers 78, it is also possible to regrow substrate layer 76 and protective layer 80.

In step 6 the top portion of mask 88 is removed, preferably by chemical methods. Then, electrical contact 82, in this case of the p-type, is evaporated on laser post 90 to complete the production process.

DESCRIPTION—ALTERNATE EMBODIMENTS

Numerous embodiments of the single mode laser according to the invention are possible. A few of those are discussed below.

Figure 10:
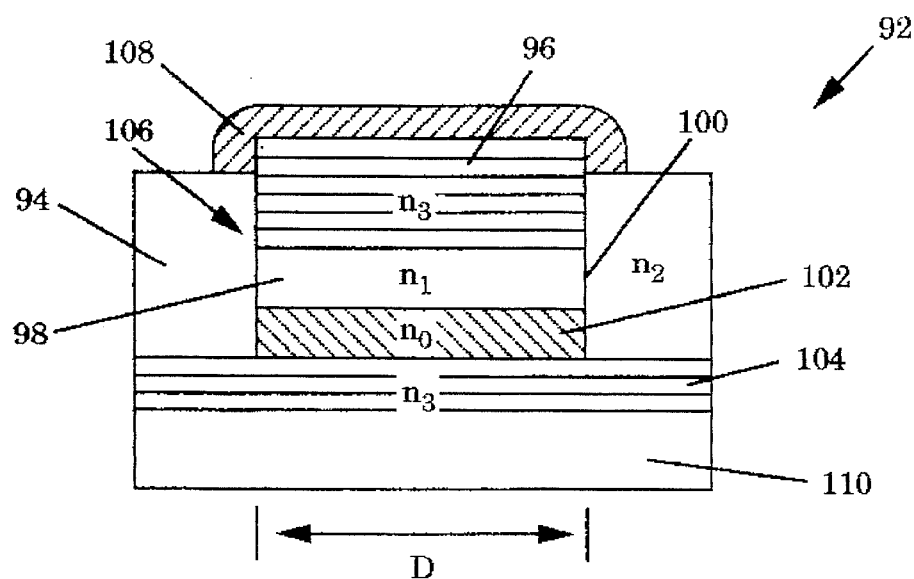
FIG. 10 is a sectional side view of a single mode laser according to the invention grown in a cavity in a high refractive index substrate.

FIG. 10 shows a sectional side view of a single mode laser 92 according to the invention. The main elements of laser 92 are deposited in a cavity 100 in a high refractive index substrate 94. In particular, six reflecting layers 96, a spacer layer 98, and a lasing medium layer 102 are superposed inside cavity 100. Any known deposition process, such as OMCVD, can be used for growing these layers.

Three reflective layers 104 are embedded in substrate 94 immediately below lasing medium layer 102. Together, reflective layers 96, spacer layer 98, lasing medium layer 102, and reflecting layers 104 constitute a laser cavity 106. Meanwhile, substrate 94 constitutes the passive antiguide. A top electrical contact 108 is provided on top of the uppermost reflecting layer 96. A support layer 110 located below reflecting layers 104 serves as the bottom electrical contact and the window through which laser light is coupled out.

Laser 92 operates just like the preferred embodiment of FIG. 8. Current I is passed through laser cavity 106 between electrical contact 108 and support layer 110. In accordance with the passive antiguide principle, higher order modes bleed into passive antiguide 94 and only the fundamental mode is sustained inside laser cavity 106. The $TEM_{00}$ laser light is coupled out through the support layer 110. Good results are obtained for beam diameters D of up 30 μm and currents up to 12×$I_{th}$. The great advantage of this embodiment resides in the ease of construction because the essential layers are grown inside cavity 100. This eliminates the need for regrowth around a post, e.g., laser post 90 (see FIG. 9).

Figure 11:
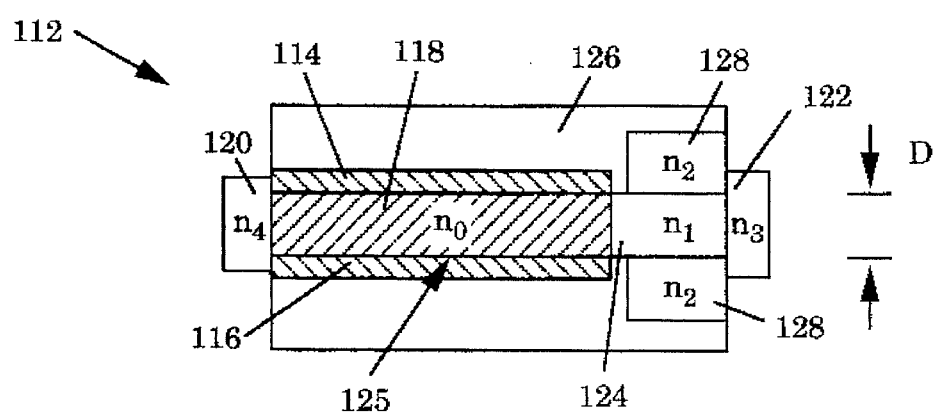
FIG. 11 is a sectional side view of an edge-emitting single mode laser according to the invention.

The embodiment in FIG. 11 is an edge-emitting single mode laser 112. It consists of two electrodes 114 and 116, a lasing medium 118, a high-reflectivity mirror 120, and a low-reflectivity mirror or output coupler 122, and a spacer 124. Elements 118, 120, 122, and 124 constitute a laser cavity 125 and reside in a substrate 126. A passive antiguide region 128 is embedded near the output coupler 122 around the end portion of laser cavity 125.

In operation, edge-emitting laser 112 experiences leakage of higher order modes into passive antiguide region 128. Consequently, high-quality, single mode emission is maintained up to high current levels. The advantage of this embodiment resides in the placement of antiguide region 128 near output coupler 122. Bleeding high order laser modes in close proximity to output coupler 122 prevents the burning of holes in coupler 122 due to excessive power intensity concentration.

Figure 12:
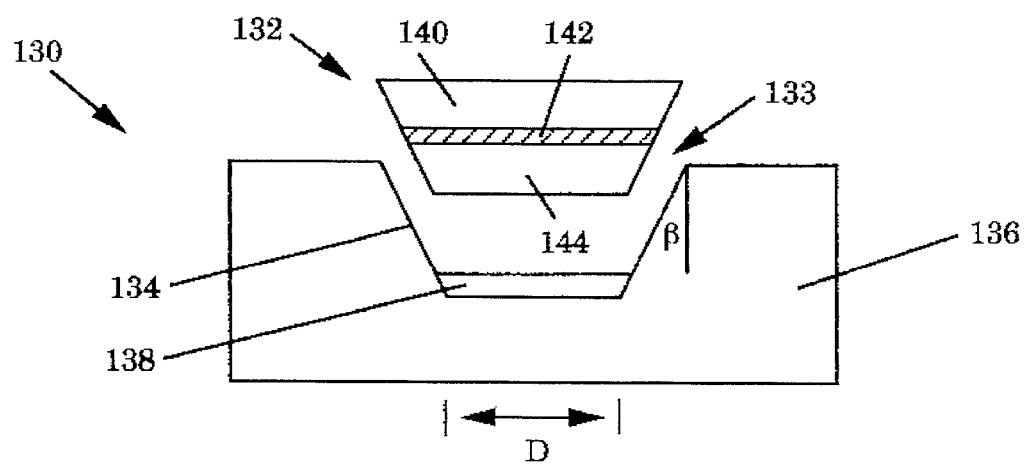
FIG. 12 is a sectional side view of a single mode laser according to the invention before being fused into an etched hole inside a wafer.

Finally, FIG. 12 shows a single mode laser 130 in which a wedge-shaped element 132 of a laser cavity 133 is fused into an etched hole 134 inside a wafer 136. Wafer 136 has a high refractive index and represents the passive antiguide. Hole 134 has a taper angle β and an output coupler 138 is embedded in its floor. Wedge-shaped element 132 includes a top reflector 140, lasing medium 142, and spacer 144.

Once element 132 is fused into hole 134 laser 130 can be operated analogously to all previous embodiments. The single mode laser beam (TEM$_{00}$) of diameter D attaining 30 μm is coupled out through output coupler 138 and wafer 136. This embodiment is particularly well-suited for industrial production, since no regrowth of layers is required.

SUMMARY, RAMIFICATIONS, AND SCOPE

The above embodiments serve but to outline of the invention and are not to be construed as limiting its scope. Many additionally changes can be introduced to the single mode laser. For example, the passive antiguide region may be broken up into several regions and positioned at selected locations along the laser cavity, e.g., at its ends. This would prevent hole burning in the reflectors. Also, passive antiguide regions could be placed adjacent to laser cavities of lasers other than solid state, e.g., gas lasers, dye lasers, excimer lasers, chemical lasers, etc. A person skilled in the art could easily effectuate all the necessary adaptations.

Therefore, the scope of the invention should be determined, not by examples given, but by the appended claims and their legal equivalents.

We claim:

1. A laser for delivering a single transverse lasing mode, said laser comprising:
   a) a laser cavity comprising a laser medium positioned between a first reflecting means and a second reflecting means;
   b) pumping means for activating said laser medium; and
   c) a passive antiguide region in contact with said laser cavity for bleeding off laser light from inside said laser cavity, whereby a different portion of each transverse mode of laser light from said laser cavity bleeds into said passive antiguide region.

2. The laser of claim 1 wherein the refractive index of said passive antiguide region is larger than the equivalent refractive index of said laser cavity.

3. The laser of claim 1 wherein the refractive index of said passive antiguide region is substantially equal to the equivalent refractive index of said laser cavity.

4. The laser of claim 3 wherein said reflecting means comprise Bragg mirrors.

5. The laser of claim 1 wherein said laser cavity further comprises spacers positioned between said lasing material and said reflecting means for selecting a wavelength λ of laser light.

6. The laser of claim 5 wherein the refractive index of said spacers is substantially larger than the refractive index of said passive antiguide region.

7. The laser of claim 5 wherein the ratio of the refractive index of said passive antiguide region to the equivalent refractive index of said laser cavity is substantially equal to 1.1.

8. The laser of claim 1 wherein said reflecting means are chosen from the group consisting of Bragg mirrors, dielectric mirrors, semiconductor/native oxide mirrors, metal mirrors, semiconductor/resin mirrors, semiconductor/air mirrors, and semiconductor/semiconductor mirrors.

9. The laser of claim 1 wherein the sides of said laser cavity are slanted at at least one predetermined taper angle β.

10. The laser of claim 9 wherein said at least one predetermined taper angle is less than 60°.

11. A laser for delivering a single transverse lasing mode, said laser comprising:
   a) a laser cavity comprising at least one laser medium layer and at least one reflective layer on each side of said active layer; and
   b) at least one passive antiguide layer deposited on a predetermined portion of said laser cavity for bleeding off laser light from inside said laser cavity, whereby a different portion of each transverse mode of laser light from said lasing cavity bleeds into said passive antiguide layer.

12. The laser of claim 11 wherein said laser cavity further comprises at least one spacer layer between said lasing material layer and said at least one reflecting layer for selecting a predetermined wavelength λ of laser light.

13. The laser of claim 12 wherein the refractive index of said passive antiguide layer is larger than the equivalent refractive index of said laser cavity.

14. The laser of claim 13 wherein said at least one reflecting layer comprises a Bragg mirror.

15. The laser of claim 13 wherein the ratio of the refractive index of said passive antiguide layer to the equivalent refractive index of said laser cavity is substantially equal to 1.1.

16. The laser of claim 12 wherein the refractive index of said passive antiguide region is substantially equal to the equivalent refractive index of said laser cavity.

17. The laser of claim 16 wherein said at least one reflecting layer comprises a Bragg mirror.

18. The laser of claim 11 wherein the sides of said laser cavity are slanted at at least one predetermined taper angle β.

19. The laser of claim 18 wherein said at least one predetermined taper angle is less than 60°.

20. The laser of claim 11 wherein said at least one reflecting layers are chosen from the group consisting of Bragg mirror layers, dielectric mirror layers, semiconductor/ native oxide mirror layers, metal mirror layers, semiconductor/resin mirror layers, and semiconductor/air mirror layers.

21. A method for sustaining a single transverse mode laser inside a laser cavity comprising a laser medium positioned between a first reflecting means and a second reflecting means, said method comprising providing a passive antiguide region adjacent and in contact with said laser cavity, whereby a predetermined portion of laser light leaks into said passive antiguide region.

* * * * *